United States Patent [19]

Benton et al.

[11] 4,195,770
[45] Apr. 1, 1980

[54] TEST GENERATOR FOR RANDOM ACCESS MEMORIES

[75] Inventors: Michael K. Benton, Paoli, Pa.; Suresh H. Sangani, Westerville, Ohio

[73] Assignee: Burroughs Corporation, Detroit, Mich.

[21] Appl. No.: 954,244

[22] Filed: Oct. 24, 1978

[51] Int. Cl.² ............................................. G11C 29/00
[52] U.S. Cl. ........................................ 371/21; 371/51
[58] Field of Search ........................... 235/302.3, 312; 365/201; 364/900

[56] References Cited

U.S. PATENT DOCUMENTS

| | | | |
|---|---|---|---|
| 3,892,955 | 7/1975 | Maejima | 235/302.3 |
| 4,055,754 | 10/1977 | Chesley | 235/302.3 |
| 4,061,908 | 12/1977 | Jonge et al. | 235/302.3 |
| 4,075,466 | 2/1978 | Jonsson et al. | 235/302.3 |

OTHER PUBLICATIONS

Bappert et al. "Memory Testing" *IBM Tech. Disclosure Bulletin* vol. 19 No. 5 Oct. 1976 p. 1621.
Arnold et al., "Pattern Generator for a Multipart Number Test System" *IBM Tech. Disclosure Bulletin* vol. 19 No. 9 Feb. 1977 pp. 3487-3488.

*Primary Examiner*—David H. Malzahn
*Attorney, Agent, or Firm*—Francis A. Varallo; Leonard C. Brenner; Kevin R. Peterson

[57] ABSTRACT

The present disclosure describes electronic circuits for detecting functional failures of random access memory (RAM) devices. The circuits generate a bit pattern sequence for each memory address location and write the pattern into the memory. Subsequently, the pattern is regenerated and compared for equality with the pattern read from the memory. A complete RAM test comprises a sequence of patterns where each pattern is made to fill the entire memory matrix once. The number of test sequence patterns is a function of the bit organization of the RAM under test. Assuming that the device under test is a RAM of the type included within the tester's repertoire of testable memory devices, failure to achieve equality of the write/read patterns is indicative of a defective RAM.

11 Claims, 10 Drawing Figures

Fig. 1

| REF. | Q4 | Q3 | Q2 | Q1 | X | X= | I0 | I1 | I2 | I3 | PATTERN |
|---|---|---|---|---|---|---|---|---|---|---|---|
| 1  | 0 | 0 | 0 | 0 | 0 | A6 | 1 | 0 | 1 | 0 | 1 |
| 2  | 0 | 0 | 0 | 0 | 1 | A6 | 1 | 0 | 1 | 0 | |
| 3  | 0 | 0 | 0 | 1 | 0 | A7 | 1 | 1 | 0 | 0 | 2 |
| 4  | 0 | 0 | 0 | 1 | 1 | A7 | 1 | 1 | 0 | 0 | |
| 5  | 0 | 0 | 1 | 0 | 0 | A0 | 1 | 1 | 1 | 1 | 3 |
| 6  | 0 | 0 | 1 | 0 | 1 | A0 | 0 | 0 | 0 | 0 | |
| 7  | 0 | 0 | 1 | 1 | 0 | A1 | 1 | 1 | 1 | 1 | 4 |
| 8  | 0 | 0 | 1 | 1 | 1 | A1 | 0 | 0 | 0 | 0 | |
| 9  | 0 | 1 | 0 | 0 | 0 | A2 | 1 | 1 | 1 | 1 | 5 |
| 10 | 0 | 1 | 0 | 0 | 1 | A2 | 0 | 0 | 0 | 0 | |
| 11 | 0 | 1 | 0 | 1 | 0 | A3 | 1 | 1 | 1 | 1 | 6 |
| 12 | 0 | 1 | 0 | 1 | 1 | A3 | 0 | 0 | 0 | 0 | |
| 13 | 0 | 1 | 1 | 0 | 0 | A4 | 1 | 1 | 1 | 1 | 7 |
| 14 | 0 | 1 | 1 | 0 | 1 | A4 | 0 | 0 | 0 | 0 | |
| 15 | 0 | 1 | 1 | 1 | 0 | A5 | 1 | 1 | 1 | 1 | 8 |
| 16 | 0 | 1 | 1 | 1 | 1 | A5 | 0 | 0 | 0 | 0 | |
| 17 | 1 | 0 | 0 | 0 | 0 | A6 | 1 | 1 | 1 | 1 | 9 |
| 18 | 1 | 0 | 0 | 0 | 1 | A6 | 0 | 0 | 0 | 0 | |
| 19 | 1 | 0 | 0 | 1 | 0 | A7 | 1 | 1 | 1 | 1 | 10 |
| 20 | 1 | 0 | 0 | 1 | 1 | A7 | 0 | 0 | 0 | 0 | |
| 21 | 1 | 0 | 1 | 0 | 0 | A8 | 1 | 1 | 1 | 1 | 11 |
| 22 | 1 | 0 | 1 | 0 | 1 | A8 | 0 | 0 | 0 | 0 | |
| 23 | 1 | 0 | 1 | 1 | 0 | A9 | 1 | 1 | 1 | 1 | 12 |
| 24 | 1 | 0 | 1 | 1 | 1 | A9 | 0 | 0 | 0 | 0 | |

*Fig.4*

TEST GENERATOR FOR RANDOM ACCESS MEMORIES

CROSS REFERENCE TO RELATED APPLICATIONS

The RAM test generator of the present invention finds particular application in the testing of high density integrated circuit devices disposed on island assemblies such as those described and claimed in application Ser. No. 513,283, which issued as U.S. Pat. No. 3,946,276, for "Island Assembly Employing Cooling Means for High Density Integrated Circuit Packaging" by Robert E. Braun et al. Also pertinent is application Ser. No. 513,278 for "Integrated Circuit Package Connector with Probing Facility", by Robert E. Braun et al, which issued as U.S. Pat. No. 3,955,867 and in which there is described and claimed a unique connector for facilitating electrical probing for test purposes. The probing fixture, which is described in the application, interfaces with the connector and may be used in connection with the RAM test generator of the present invention. Finally, the present invention may comprise a portion of a universal in-situ tester for integrated circuit devices generally, the latter tester including, for example, the "Net Analyzer for Electronic Circuits", described and claimed in Ser. No. 672,426 by William A. Lacher and issued as U.S. Pat. No. 4,009,437. All three of the foregoing patents are assigned to the same assignee as the present application.

BACKGROUND OF THE INVENTION

Present day electronic equipment, particularly data processing systems, use high density packaging of integrated circuits. As described in the referenced applications, the circuit chips are generally installed in connectors, which in turn are mounted on an interconnection board. The electrical contacts within the connector provide electrical circuit paths between the integrated circuit package leads and the conductive pads of the interconnection board.

In any electronic system, the need arises for checking the electrical integrity of the devices, preferably while they are operatively disposed in a system configuration. Such devices include those of a static random access memory (RAM). The failure of a RAM may be due to a number of malfunctions. For example, single bits or multiple bits in a memory cell or several cells may not be capable of being switched from one state to the opposite state. They are in effect "stuck" in either a "1" or "0" state. Additionally, groups of data output lines and data input lines may be electrically shorted to each other within a group or between groups. Other malfunctions may originate within the decoding networks, that is, address lines may be shorted to each other, or to data input or output lines. Moreover, the address lines may also be stuck in either a "1" or "0" state. Other malfunctions exhibited by semiconductor memories include multiple writes wherein the writing of information into one memory cell results in the same information being written into one or more other cells randomly disposed within the memory, that is, the last mentioned cells act as though they are shorted to one another. Malfunctions may also involve access time measurement and sense amplifier sensitivity. In the former, the memory may not produce information at the specified access time when each read cycle is preceded by a write cycle. In the latter, the memory may not respond with the proper information after sending a long series of similar data bits followed by a single transition of the opposite state. Finally, pattern sensitivity may cause the contents of a cell to be complemented due to the read or write operation of an adjacent cell.

It is readily apparent that in a high density packaging system, the individual checking of the numerous integrated memory circuit pin connections becomes a complex and time consuming task. The present invention obviates this difficulty by exercising the RAM devices with a predetermined number of generated test patterns in accordance with the bit organization of the RAM under test, and continuously compares results during the test sequence to determine if the RAM device is functionally good or bad. As compared with present-day systems for testing RAMs involving the use of checkerboard patterns in which alternating "1's" and "0's" are used in two dimensions, or columns or rows of alternating "1's" and "0's", the present invention requires far fewer steps or patterns in performing a substantially complete functional RAM test. This in turn, results in a considerable saving in the time required for the test.

SUMMARY OF THE INVENTION

In accordance with the invention, the RAM test generator exercises RAM's by writing patterns into the memory and reading them out again so that they may be compared with the original pattern. More specifically, the test circuits generate a bit pattern for each address location when writing into the memory and then subsequently regenerate the same pattern while reading from the memory in order that the two patterns may be compared for equality. It is apparent that instead of regenerating the pattern, the initial pattern written into the memory could be stored for its later use, but this would require special storage capacity in the tester circuits. A complete RAM test comprises a sequence of predetermined patterns in which each pattern is made to fill the entire memory matrix once. Only a very small number of patterns are required for the functional testing of a variety of RAM's.

The present test generator provides the memory devices under test with both input data and address inputs. A number of different types of integrated circuit chips may be tested. The generator is designed to operate under the direction of a computer which is programmed as a control unit. Thus, the computer control unit provides clock signals to the RAM test generator and activates the selection lines which determine the type of chip test to be implemented. Moreover, the control unit performs other functions such as the monitoring of signals from the RAM test generator indicating RAM failures, and voltage levels on the respective "pattern finished," "last pattern", "end of test" lines, etc. The control unit is programmed to abort a test sequence when an error is detected. If a RAM fails all of the tests applied, then it may be assumed that the device under test is either a defective RAM, a memory device which the test generator is not designed to test or a device which is not of the RAM variety. On the other hand, if a RAM device passes any of the tests, it is considered to be an acceptable RAM of the type being tested.

Other features and advantages of the present invention will become apparent in the detailed description of the generator and its mode of operation which follow.

BRIEF DESCRIPTION OF THE DRAWINGS

FIG. 1 is a table showing a sequence of four bit patterns generated by the present RAM test generator to be written into each address of the RAM.

FIG. 4 is a table correlating a plurality of counter-divided binary inputs applied to the memory input logic circuits of the RAM test generator with the output patterns generated in response thereto by the circuits.

DESCRIPTION OF THE PREFERRED EMBODIMENT

Figure 1:
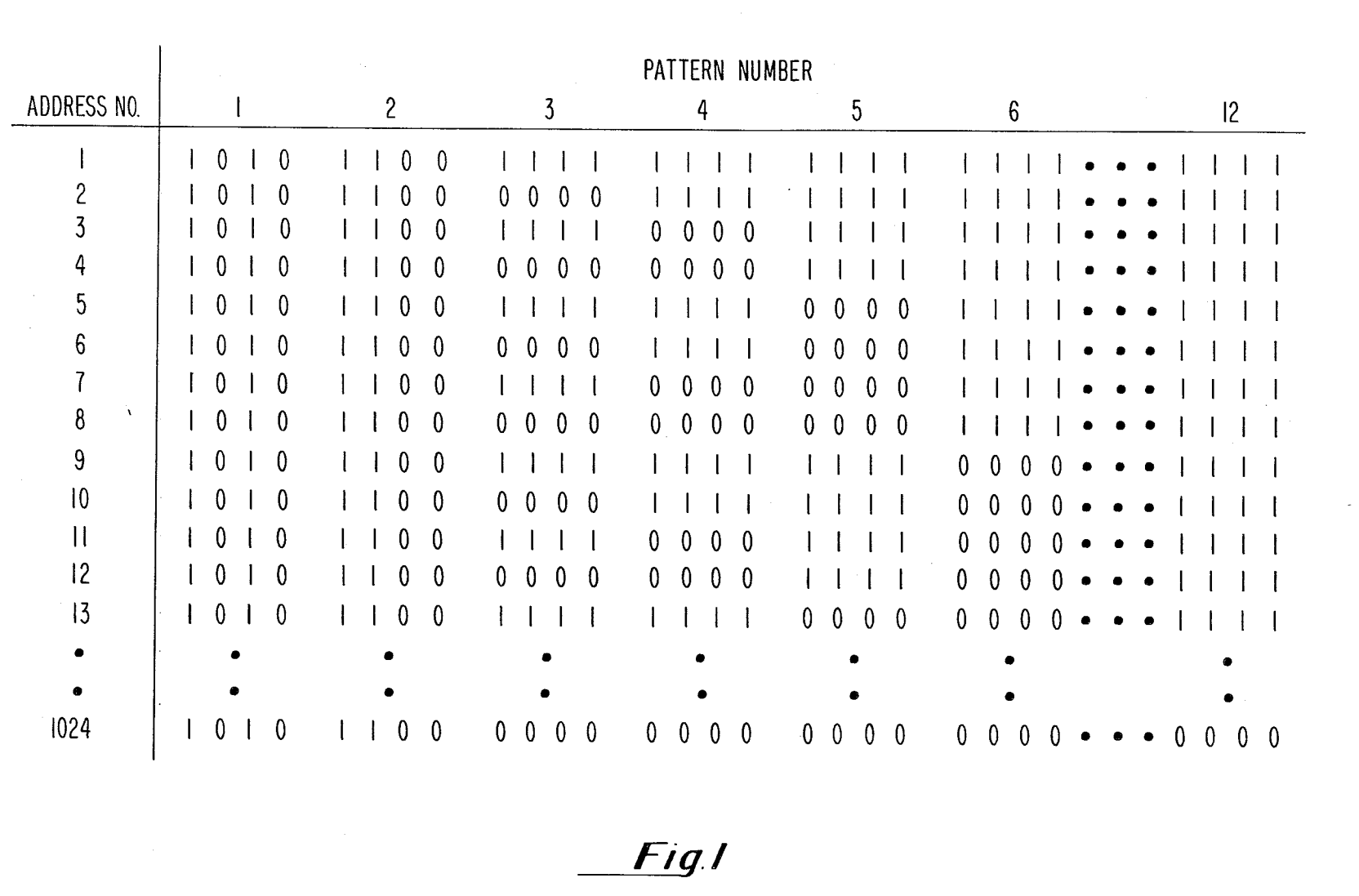
Figure 2:
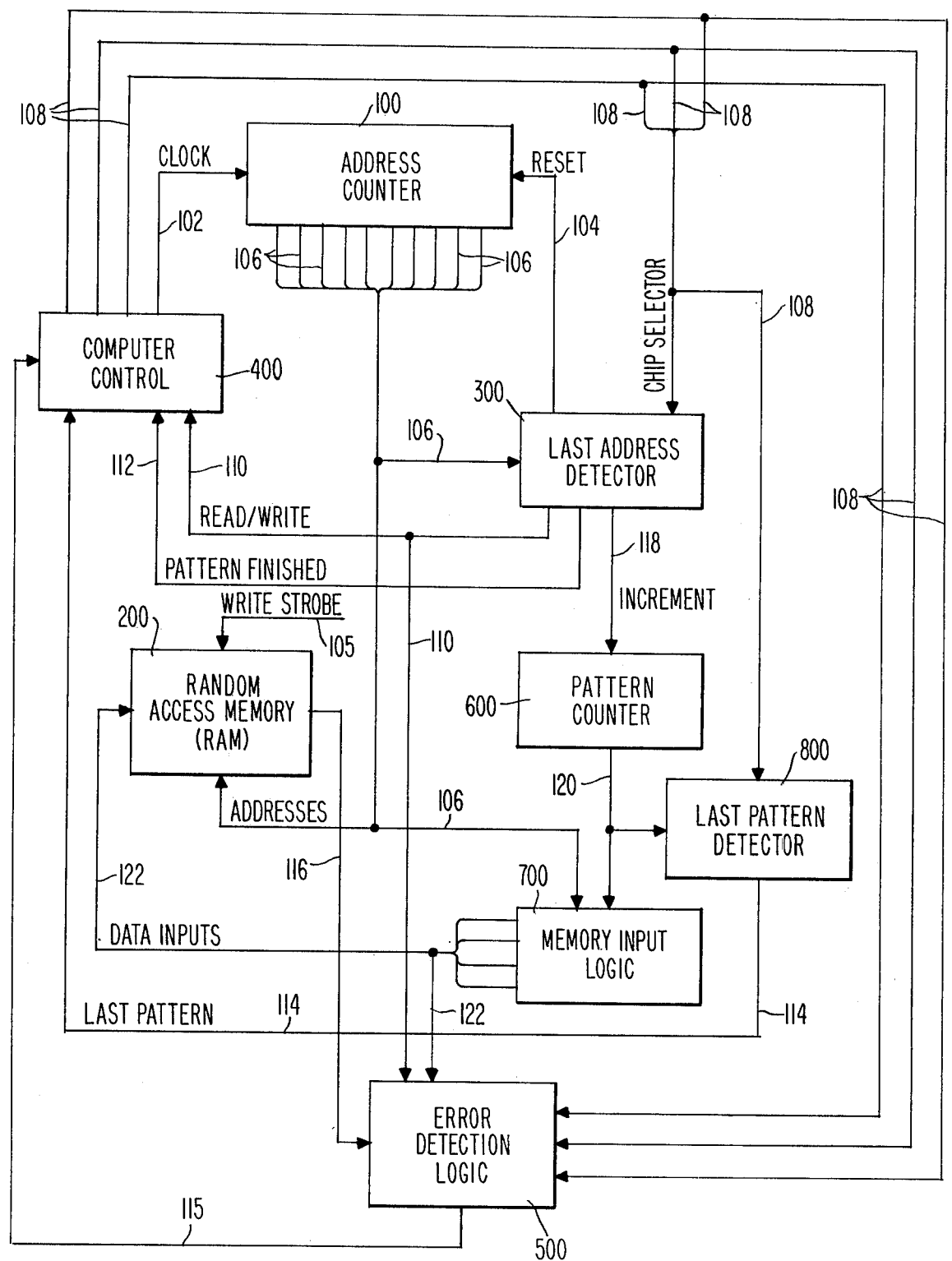
FIG. 2 is a simplified block diagram of the RAM test generator.

FIG. 1 depicts in tabular form the sequence of a plurality of memory input patterns. The bit codes in the form of binary "1's" and "0's" are generated by the RAM test generator of the present invention in a manner to be described hereinafter. The patterns are numbered 1 through 12 and each is assumed to be 4 bits wide, although it should be understood that memories having less than, or more than, 4 data inputs may utilize the test technique disclosed herein.

Reference to the table of FIG. 1 indicates that pattern 1 employs alternate "1's" and "0's", thus the four inputs to each address is "1010". Pattern 2 utilizes two "1's" followed by two "0's", thus, "1100". Pattern 3 uses four "1's" followed by four "0's". In this case, the pattern written into the memory cell at the first address is "1111", and that written into the cell at the second address is "0000". The pattern then repeats, such that the third address contains four "1's". Similarly, pattern four uses eight "1's", followed by eight "0's". Accordingly, the storage elements at the first and second addresses contain all "1's" while those at the third and fourth addresses, all "0's". The final pattern for the RAM memory fills the first half of the memory with "1's", and the second half with "0's". The number (N) of general patterns required to fully test a J by K RAM is given by the expression:

$$N = \ln J + \ln K/(\ln 2)$$

As noted earlier, the pattern width of four bits was chosen as representative, but is not limitative of the invention. Similarly, the maximum number of addresses shown in the table of FIG. 1, namely 1024, has also been selected for purposes of example and likewise, is not a limiting factor. It should be observed that if the memory device under test has less than four inputs, the unnecessary inputs are disregarded. However, because of the four input format, one or two patterns in addition to the number derived from the foregoing equation, will be required to fully test the RAM. This condition occurs because a 1 or 2 input RAM misses part of the first and second pattern. For example, a 16×4 memory, uses all the available four inputs, and is fully tested in accordance with the equation with the patterns 1 through 6, applied in sequence. That is, six patterns are required which are 4 bits wide and 16 addresses long. On the other hand, a RAM which is 1024×1, has only a one bit input and therefore uses only one column of each pattern. Accordingly, patterns 1 and 2 will fill all the memory cells of the RAM with binary "1's". It is only until pattern 3 is applied, that the memory begins to be exercised with alternating "1's" and "0's". Since the pattern equation requires 10 valid patterns to be applied to the RAM, it is necessary that the RAM test generator exercise the RAM with a sequence ending with pattern 12. Obviously a 256×4 RAM will be fully tested by exercising it with patterns 1 through 10. A RAM which is characterized as being 256×12, but really consists of three 256×4 chips in a common package may be tested by connecting the respective three sets of input lines in common and checking the outputs of each one third of the memory device independently.

A somewhat simplified block diagram of the RAM test generator appears in FIG. 2. An Address Counter 100 is provided which is comprised of a ten bit binary counter with respective Clock and Reset inputs on lines 102 and 104. The 10 address lines 106 drive the address inputs of the RAM 200 under test. A write strobe is applied to the RAM 200 via line 105. A Last Address Detector 300 is also part of the test generator. This detector receives inputs from the Address Counter 100 on line 106 and from a plurality of chip type selector lines 108. There is one chip type selector line for each different type of RAM which the generator is designed to test. To run a test for a particular chip type, the appropriate selector line 108 corresponding to that chip is activated. The Last Address Detector 300 has a Read/Write output line 110 which is adapted to be "low" for a write operation into the RAM and "high" for a read operation. Upon commencement of a RAM test, the Read/Write line 110 is normally "low", signifying a write mode.

The Computer Control Unit 400 applies clock pulses to the Address Counter 100 via line 102 so long as the Pattern Finished line 112 and Last Pattern line 114 remain in the "low" state. When the final address is reached for the chip type selected on lines 108, the Read/Write line 110 goes "high" signifying the beginning of the read mode, and the Address Counter 100 is reset to zero by virtue of the signal on Reset line 104. The Pattern Finished line 114, however, stays "low" and therefore the Computer Control Unit 400 continues to apply Clock pulses to the Address Counter 100 by way of line 102. The data stored in the RAM is then being read while the same pattern is concurrently being regenerated by the tester for comparison in the Error Detection Logic 500. The latter receives the data inputs on line 122 regenerated by the Memory Input Logic 700, the data being read out of the RAM 200 via line 116, an additional input from a chip selection line 108 and an enabling input from Read/Write line 110. The Error Detection Logic 500 provides an output to the computer Control Unit 400 on line 115. A "high" signal level on the last mentioned line may be interpreted to mean that an error has been detected in the RAM 200 under test.

When the final address of the RAM 200 under test is reached a second time, the Address Counter 100 is again reset via Reset line 104, the Read/Write line 110 goes "low", the Pattern Finished line 112 goes "high" and the Pattern Counter 600 is incremented via line 118. As will be explained in detail hereinafter, it is the output of the Pattern Counter 600 which when applied to the Memory Input Logic 700 via line 120 that generates the sequence of patterns as shown in FIG. 1. With the new pattern count, the Memory Input Logic 700 generates the next succeeding pattern which appears on the Data Input lines 122 of the RAM 200. The RAM test generator of the present invention continues to exercise the RAM through a sequence of patterns determined by the memory organization as explained hereinbefore. Ultimately, the last pattern for the memory chip type selected is detected by the Last Pattern Detector 800 which receives inputs from both the chip selection lines 108 and the Pattern Counter 600 via line 120. When this condition occurs, the Last Pattern line 114 goes "high", and this voltage level is applied to the Computer Control Unit 400. When both the Pattern Finished line 112 and the Last Pattern line 114 are concurrently "high", then the end of the last pattern has been reached. Since during each read cycle, the Error Detection Logic 500 has checked the equality of the data read from the RAM with that previously written therein, the attainment of the end of the last pattern indicates that no malfunction of the RAM has been detected, since the occurrence of an error at any point in the test sequence would have terminated the test at that time. Accordingly, when the Last Pattern line 114 and the Pattern Finished line 112 both go "high", the RAM 200 has successfully passed the test. The Computer Control Unit 400 in response to this condition, halts the testing procedure and, although not shown in FIG. 2, may provide a visual indication, such as by illuminated indicators on a display panel, of the successful test completion. On the other hand, detection of a failure by the Error Detection Logic 500 during the read cycle of any pattern as indicated by the level of line 115, causes the RAM test generator to be reset, and a new chip type selected via its appropriate selection line 108. This is done because the chip failure may have been caused, not by any intrinsic defect therein, but because through faulty identification the chip tested was not the one identified by the initial Chip Selection line. However, when failures for the unit under test occur on all the chip selection lines, the Computer Control Unit 400 assumes that either the chip under test is a defective RAM, or not a memory chip at all. For example, the chip, although thought to be of the memory type, might actually be a combinatorial logic chip. In either event, the "fail" condition may be indicated on a display panel.

Figure 3:
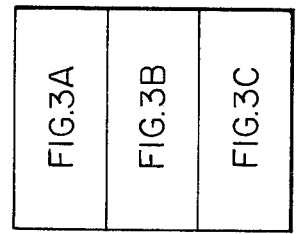
FIG. 3 comprises FIG. 3A, 3B and 3C which together provide a detailed logic circuit diagram of the RAM test generator of the present invention.
Figure 3C:
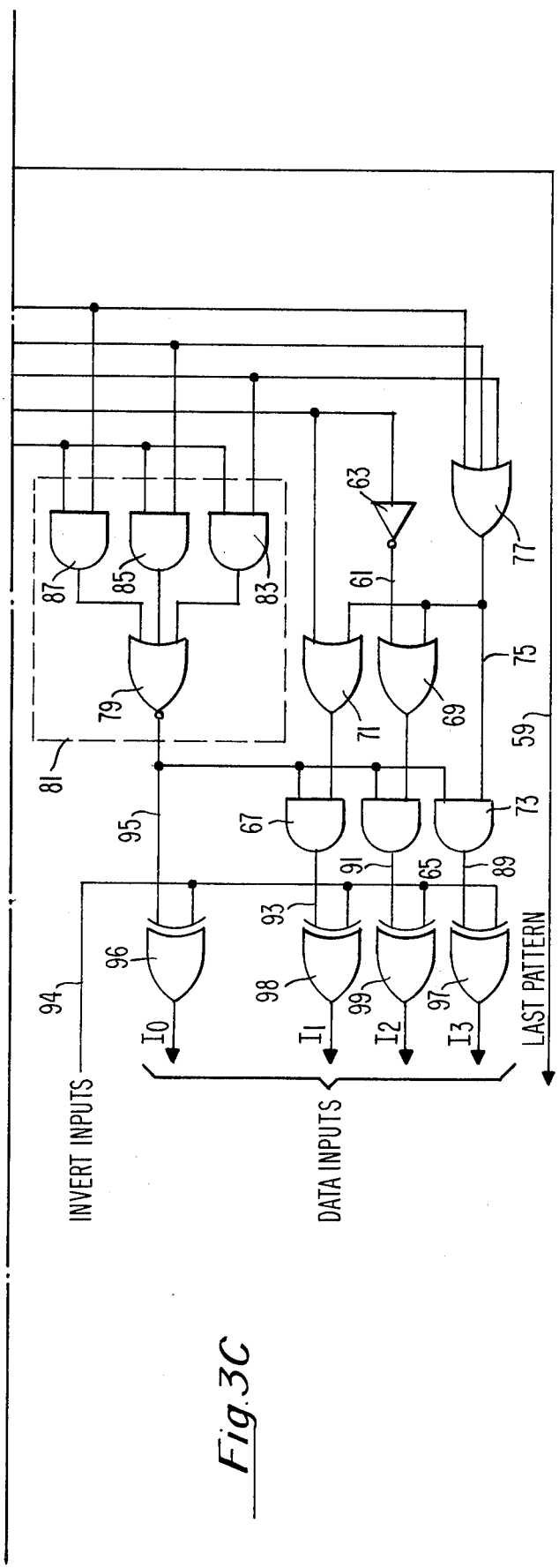
Figure 7:
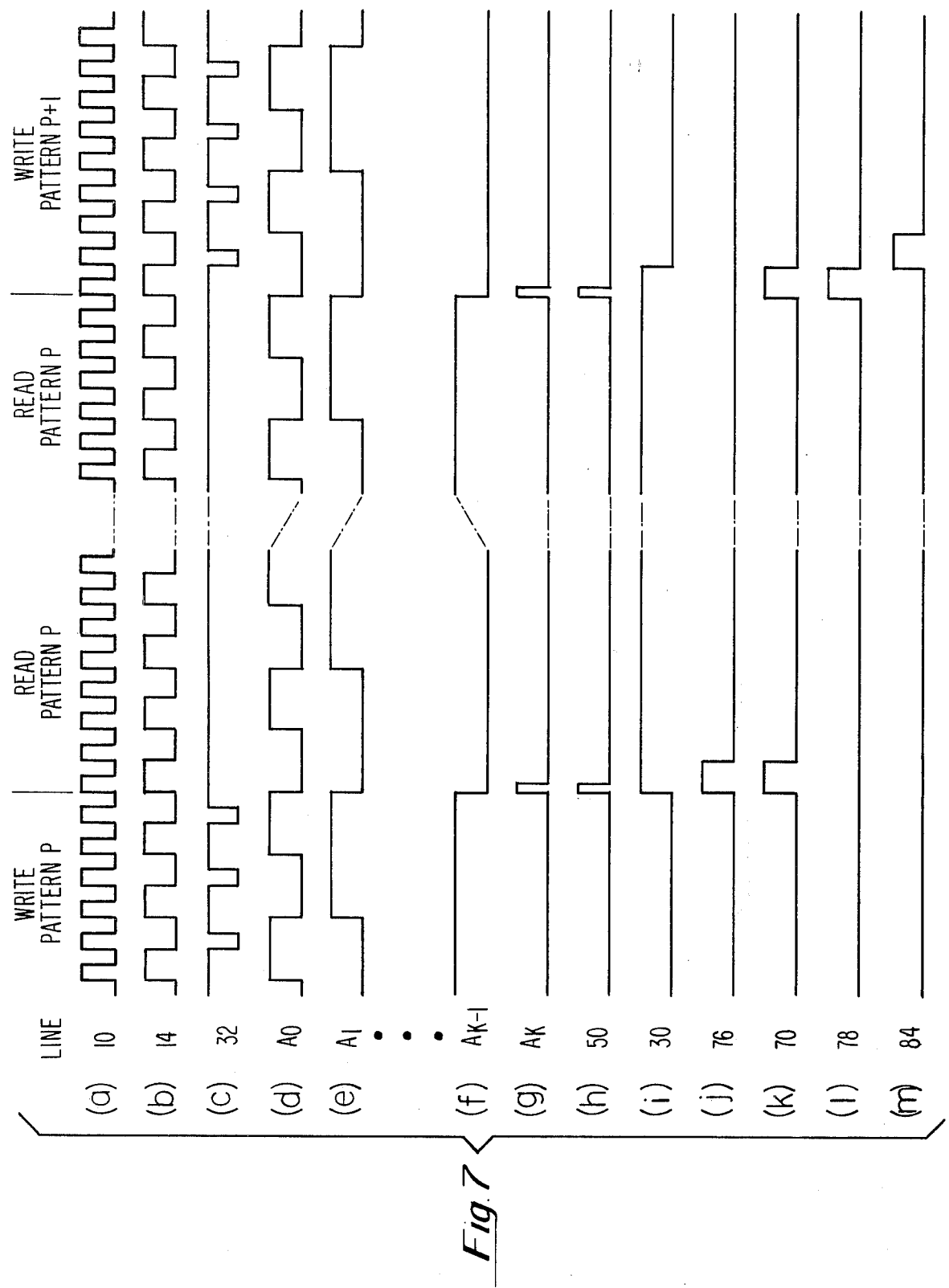
FIG. 7 is a generalized timing diagram for the pattern generator test sequence.

In an actual operative embodiment of the RAM test generator, the functions indicated by the block diagram of FIG. 2 were implemented by the logic schematic of FIG. 3. With general reference to FIG. 2 and more specific reference to FIG. 3, along with the timing diagram of FIG. 7, the Clock pulses on line 10 derived from the Computer Control Unit 400 (FIG. 2) and depicted in FIG. 7a, are applied to a Flip-Flop 12. The output of Flip-Flop 12 toggles once with every period of the Clock Line so that the frequency of the output of Flip-Flop 12 on line 14 (FIG. 7b) is one-half that of the RAM clock frequency. The output of Flip-Flop 12 appearing on line 14 is applied in common to the clock inputs (CK) of counters 16a, 16b and 16c which together form the Address Counter 100 of FIG. 2. The inverted output of Flip-Flop 12 appearing on line 18 is applied to one input of AND gate 20, while the other input to AND gate 20 is coupled to the RAM Clock line 10. Consequently, the output of AND gate 20 on line 22 is a stream of positive pulses whose duration is one-fourth of the clock period feeding into the Address Counter on lines 14. This last stream of pulses on line 22 forms one input for NAND gate 24. The other input to NAND gate 24 appearing on line 26 comes from the inverted output side ($\overline{Q}$) of Flip-Flop 28. This last Flip-Flop 28 also provides on its Q output terminal voltage levels which appear on the Read/Write line 30 coupled thereto. Since the Read/Write line 30 is "high" during a read cycle and "low" during a write cycle, then the second input to NAND gate 24 on line 26 is just the opposite. Therefore, the output of NAND gate 24 is a stream of negative pulses (FIG. 7c) which are enabled only during the write cycle. These negative pulses appear on the Write Strobe line 32 and are applied to the RAM 200 (FIG. 2).

The OR gate 34 has inputs on lines TL08 and TM37. Similarly AND gate 36 has one input on line TM06. Lines TL08, TM37 and TM06 correspond to the Chip Selector lines 108 of FIG. 2 and are coupled to the Computer Control Unit 400. The "T" prefix designations correspond respectively to the "2" prefix labels of three types of RAM memory chips, namely 2M06, a 16×4 matrix, 2M37, a 256×4 matrix and 2L08, a 256×4 matrix, which is three wide. It should be understood that these chip types and others referred to herein are included solely for purpose of example in describing the operation of the RAM tester, and are not in any way limitative or restrictive of the tester's capability. Line TM06 is AND'ed with address line $A_4$ represented by line $A_k$ in FIG. 7g, (from the $Q_1$ terminal of the 16b section of the Address Counter) by virtue of gate 36. The $A_4$ address line (FIG. 7g) will go "high" after sixteen address counts, that is, concurrent with the level on the $A_3$ line (represented by line $A_{k-1}$ of FIG. 7f) going "low". It should be apparent that $A_0$ (FIG. 7d) represents the least significant bit of the RAM address; $A_1$ (FIG. 7e) the second significant bit; and $A_3$ (FIG. 7f), the fourth significant bit, that is $2^4=16$. Therefore, the output of AND gate 36 on line 38 will go "high" whenever the TM06 selector line is "high" and sixteen addresses have been counted. Stated another way, the output of AND gate 36 goes "high" whenever a 2M06 chip has been completely written into by each of the patterns of "1's" and "0's", seen in FIG. 1.

The 2L08 and 2M37 chips are both 256 addresses long. The corresponding TL08 and TM37 lines are OR'ed together in gate 34 and are applied via line 40 to one input of AND gate 42. The second input to gate 40 is derived from address line $A_8$ (Q terminal of 16c). This last line will go "high" after 256 addresses have been counted. Therefore, the output of AND gate 42 on line 44 goes "high" after either the 2L08 on the 2M37 chips have been written into completely.

Another chip tested by the present circuit is a 2M15 which is a 1024×1 matrix. If it is assumed for purpose of explanation that 1024 is the highest address desired to be counted (as was the case in an actual operating system), then the RAM test generator may be designed to stop automatically when it reaches this prescribed "maximum" count. Therefore, if none of the selector lines TL08, TM37 or TM06 is "high", that is, selected by the Computer Control Unit 400, the tester assumes that the device under test is of the 2M15 type. This is accomplished as follows. The outputs of AND gates 36 and 42 on respective lines 38 and 44, and the output on line 46 designated $Q_3$ of counter 16c are OR'ed together in gate 48. The output of OR gate 48 on line 50 (FIG. 7h) is applied in common to the clock inputs (CK) of D-type Flip-Flops 28 and 52. In effect, Flip-Flops 28 and 52 are clocked whenever a final count is reached for the chip type selected.

Mention is required at this time of the action of the Reset pulse appearing on line 54 and derived from the Computer Control Unit 400. When line 54 goes "high" prior to the start of a RAM test, the output of OR gate 56 also goes high, resetting Flip-Flops 28 and 52 via line 58 and their respective CR terminals. The D terminal of Flip-Flop 28 is assumed to be coupled to a source (not shown) which keeps the terminal level "high". Also reset are Flip-Flop 60 via inverter 62 and the counters 16a, 16b and 16c (which form the Address Counter 100), via OR gates 64 and 66. The outputs of the latter appear respectively on lines 68 and 70. Flip-Flop 72 is assumed to be part of a common package with Flip-Flop 60 and has a common clock and reset. Accordingly, the resetting of Flip-Flop 60 effects the resetting of Flip-Flop 72. In the reset condition, the $\overline{Q}$ outputs of Flip-Flops 28, 52, 60 and 72 are all "low". The Q output of Flip-Flop 28 on line 26 is "high", enabling NAND gate 24 and permitting Write Strobe pulses (FIG. 7c) to appear on line 32. Since the D input on Flip-Flop 28 is also "high", a pulse on the clock input terminal, CK, derived from OR gate 48 and signifying the completion of an address count, will cause the Q output of Flip-Flop 28 to go "high". The last mentioned output is connected to the Read/Write line 30 (FIG. 7i), which in going "high", signals the start of a Read cycle. Concurrently, the output of Flip-Flop 28 on its $\overline{Q}$ terminal will go "low", disabling NAND gate 24 via line 26, and terminating the Write Strobe pulses on line 32.

Since Flip-Flop 72 has been reset, its $\overline{Q}$ output terminal is "high". When the Q output of Flip-Flop 28 goes "high" at the start of the Read cycle, the output of AND gate 74 on line 76 also goes "high". Since the D input of Flip-Flop 72 is also connected to the Q output of Flip-Flop 28 the $\overline{Q}$ output of Flip-Flop 72 will go "low" at the next clock pulse of the RAM clock input. This causes a one RAM clock period pulse to emanate from AND gate 74 on line 76 (FIG. 7j). This last pulse passes through OR gates 64 and 66 and resets counters 16a, 16b and 16c via line 70 (FIG. 7k).

At this point—the beginning of the Read cycle, the Read/Write line 30 is "low", and the counters 16a through 16c which form the Address Counter 100 are reset to zero. When the last mentioned counters reach a final count for the RAM chip type selected, a second pulse will appear on the CK (Clock) inputs of Flip-Flops 28 and 52. This causes the Q output of Flip-Flop 52 to go "high", which in turn results in the Pattern Finished line 78 (FIG. 7l) going "high". The latter line is coupled to the Computer Control Unit 400. This signifies the end of a pattern. An input to respective gates 66 and 80 also goes "high". Since the second input to OR gate 66 on line 68 is "low", the "high" on line 78 causes the output of gate 66 to go "high", thereby resetting the counters 16a through 16c. The second input to AND gate 80 occurs on $\overline{\text{Hold Pattern Input}}$ line 82 from the Computer Control Unit 400. Line 82 is held "high" until the end of the test, so that the positive transition on the first input of AND gate 80 causes its output to go "high", clocking the Pattern Counter 600. On the next RAM Clock Pulse on line 10, the Q output of Flip-Flop 60 will go "high", causing line 84 (FIG. 7m) to go "high" and Flip-Flops 28 and 52 to be cleared via OR gate 56. Thus, a complete write and read cycle for one input pattern applied to the RAM has been completed.

The Pattern Counter 600 has been incremented as explained hereinbefore; the address counters 16a through 16c have been reset; and Flip-Flops 28 and 52 have been reset enabling the Write Strobe on line 32.

The outputs of Pattern Counter 600 are labeled "$Q_1$, $Q_2$, $Q_3$ and $Q_4$". The output of a multiplexor, referred to hereinafter as Data Selector 86, is labeled "X". These are the variables which define the data inputs $I_0$, $I_1$, $I_2$, and $I_3$ to the RAM 200. Data Selector 86 selects as its "X" output, one of the eight inputs $X_0$ through $X_7$ which correspond to the binary value on its selector inputs A, B, and C.

The function of the Pattern Counter 600 and Data Selector 86 in combination with the Memory Input Logic 700 (FIG. 2) to be defined in detail hereinafter, is best explained in connection with FIG. 4 along with FIGS. 2 and 3. The binary count from 0 to 11 represented by $Q_1$ thru $Q_4$ in the table correspond to the patterns 1 through 12 depicted in FIG. 1. The "1's" and "0's" of $Q_1$ through $Q_4$ are inputs to the Memory Input Logic 700. Also, "X" is an input to this logic. As noted above, "X" is the output of an eight line to one line multiplexor or Data Selector 86. Inputs to the Data Selector on terminals $X_0$ through $X_7$ are derived from address lines $A_0$ through $A_9$. These are the same address lines which control the RAM under test. The column in FIG. 4 labeled "X=", shows which address line is being selected by Data Selector and hence, the "X" input to the Memory Input Logic.

The control lines 88, 90 and 92 of Data Selector 86 are coupled respectively to the A, B and C terminals thereof. The last mentioned lines are driven respectively by the $Q_1$, $Q_2$ and $Q_3$ outputs of Pattern Counter 600. For example, in operation reference line 1 of FIG. 4 indicates that the binary code 0,0,0 on $Q_3$, $Q_2$ and $Q_1$ respectively, causes Data Selector 86 to select Address Line $A_6$ which is "low" and is coupled via line 11 to its $X_0$ terminal. Under this condition, the Memory Input Logic 700 provides a 1,0,1,0 pattern. The same pattern is generated in reference line 2, where Address Line $A_6$ is "high" and X=1. Binary Code 0,0,1 selects Address Line $A_7$ via line 13 coupled to terminal $X_1$ of the Data Selector 86. In reference lines 5 and 6 of FIG. 4 binary code 0,1,0 on lines $Q_3$, $Q_2$, $Q_1$ respectively selects Address Line $A_0$ when terminal $Q_4$ of the Pattern Counter 600 is "low", that is "0", and as seen in reference lines 21, 22 of FIG. 4 $A_8$ when $Q_4$ is "high" or "1". This is accomplished in the logic network comprised of AND gates 15, 17, 19 and 21, OR gates 23, 25, and inverter 27. Thus, when $Q_4$ is "low", the output of inverter 27 is "high" enabling AND gate 15 and permitting the selection of $A_0$ via OR gate 23 and line 29 coupled to terminal $X_2$ of Data Selector 86. When $Q_4$ is "high", AND gate 17 is enabled and $A_8$ is selected via OR gate 23, line 29, and the $X_2$ terminal. In a similar manner, 0,1,1 or binary "three" selects $A_1$ when $Q_4$ is "low" and $A_9$ when $Q_4$ is "high". In the former, the signal output from inverter 27 enables AND gate 19, and $A_1$ is selected via OR gate 25 line 31 and the X terminal. In the latter where $Q_4$ is "1", AND gate 21 is enabled, and $A_9$ is selected. Moreover, 1,0,0 or binary "four" selects $A_2$ via line 33 and terminal $X_4$; 1,0,1 selects $A_3$ via line 35 and terminal $X_5$; 1,1,0 selects $A_4$ via line 37 and terminal $X_6$; and 1,1,1 on the Data Selector Control Lines C, B, A (Pattern Counter Outputs $Q_3$, $Q_2$, $Q_1$ selects Address line $A_5$ via line 39 and terminal $X_7$ to appear as the "X" input to the Memory Input Logic 700.

The function of the "X" input is as follows. If Address Line $A_0$ is the least significant bit of the address count, its value alternates between "0" and "1" with each consecutive address. Reference to Pattern 3 in the table of FIG. 1, indicates that all four data lines $I_0, I_1, I_2, I_3$ also alternate their value with each consecutive address. Therefore, in order to generate Pattern 3, the data lines must simply change state whenever the $A_0$ address line changes state. Note in FIG. 4, reference line 5 indicates that when X=0 ($A_0$ also is "0") and that the outputs on all four data lines are the same and are the complement of the "X" input to the Memory Input Logic. Reference line 6 indicates that when X=1, the data inputs are all "0". Likewise for Pattern 4 (FIG. 1), the $A_1$ Address Line is selected as the "X" input to the Memory Input Logic 700. Since $A_1$ is the second significant bit of the binary address count, it changes state with every two consecutive addresses, as do the data lines in Pattern 4. In Pattern 5, $A_2$ is selected and the data lines change state with every fourth consecutive address, as does the $A_2$ address line. The same is true for successive patterns up to Pattern 12 where $A_9$ is selected and changes state after every 512 consecutive addresses. This is sufficient for writing 512 "1's" followed by 512 "0's", which is the final pattern required for testing a memory which has 1024 addresses. In summary, the tester logic is designed to observe the outputs $Q_4$ through $Q_1$, from the Pattern Counter. The sequence of patterns required by the tester to completely test a RAM includes two series of patterns. The first series is provided if the Pattern Counter outputs are 0,0,0,0 and 0,0,0,1 respectively. When the counter reads 0,0,0,0 then the data inputs to the RAM, namely $I_0$ and $I_2$ are "1", and $I_1$ and $I_3$ are "0". When the Pattern Counter reads 0,0,0,1 then $I_0$ and $I_1$ are "1"; $I_2$ and $I_3$ are "0". The second series encompasses all other pattern configurations, in which all four data inputs to the RAM are the complement of the "X" input to the Memory Logic 700. In this manner, the sequence of patterns depicted in FIG. 1 is generated by the present invention.

Returning to a description of the tester operation and with specific reference to FIG. 3, the Invert Inputs line 94 drives one of the inputs to each of the Exclusive OR gates 96, 97, 98 and 99. The last mentioned line is controlled by the Computer Control Unit 400 and stays "low" until the last pattern has been implemented. With the Invert Inputs line "low", data appearing on the other input terminal lines 95, 93, 91 and 89 respectively of each of the aforementioned Exclusive-OR gates propagates therethrough unaltered.

When implementing patterns "3" through "12", one or more of the lines $Q_2$, $Q_3$ and $Q_4$ of the Pattern Counter 600 will be "high". This means that one or more of the AND gates 87, 85, 83 in Logic Package 81 will be "high" and further, that the value of the "X" output of the Data Selector 86 determines the logic value of the enabled AND gates. The last mentioned gates are NOR'ed together in gate 79 so that the output of Logic Package 81 on line 95 is always the complement of "X" whenever the tester is implementing patterns "3" through "12". Moreover, during the implementation of the latter patterns, one or more of the inputs of OR gate 77 will be "high". If this is true, the output of OR gate 77 on line 75 will be "high", enabling AND gate 73 to follow the output of Logic Package 81. The "high" output of OR gate 77 on line 75 will propagate through OR gates 71 and, also enabling AND gates 65 and 67 to follow the output of Logic Package 81.

Summarizing the latter operation, during patterns "3" through "12", the data inputs, $I_0, I_1, I_2$ and $I_3$, to the RAM 200 under test, will be the complement of the "X" output of the Data Selector 86.

Patterns "1" and "2" represent a different tester operational sequence. During pattern "1", the outputs of the Pattern Counter 600, namely $Q_1, Q_2, Q_3$ and $Q_4$ are all "0". The AND gates 83, 85 and 87 in Logic Package 81 are all disabled, and the output of Logic Package 81 remains a "1" by virtue of NOR gate 79, The outputs of the RAM are therefore as follows: $I_0$ an output of gate 96 is also a "1". Since the inputs to OR gate 71 are both "0", the output of gate 71 is also "0". This causes the output of AND gate 67 to also be "0", and the $I_1$ output of gate 98 to RAM 200 to be "0". The output of inverter 63 on line 61 is a "1". This results in the output of OR gate 69 being a "1", and since both inputs to AND gate 65 are a "1", $I_2$, the output of Exclusive-OR gate 99 is also "1". The output of OR gate 77 on line 75 is a "0", causing the output of AND gate 73 to be "0" and $I_3$ from gate 97 to be "0". Thus, the data pattern identified as "pattern 1" in FIG. 1, and comprising for $I_0, I_1, I_2$ and $I_3$ respectively a "1,0,1,0" pattern has been generated. In order to generate a "pattern 2" sequence, the only change from the last described operation is that the output $Q_1$ from the Pattern Counter is "high". This results in the data inputs to the RAM being as follows. $I_0$ and $I_1$ are each "1" and $I_2$ and $I_3$ are each "0". These outputs remain as such throughout the pattern. The Memory Input Logic 700 of FIG. 2 identified hereinbefore as receiving the "X" inputs from Data Selector 86 and of generating the data inputs to $I_0$ through $I_3$ for the RAM, is comprised generally of the Logic Package 81, Exclusive-OR gates 96, 97, 98 and 99, and gates 65, 67 and 73, OR gates 69, 71 and 77 and inverter 63.

The Last Pattern line 59 goes "high" whenever the output of OR gate 57 goes high. This happens whenever the respective outputs of AND gates 55, 53 and 51 go "high". The output of AND gate 51 will go "high" whenever the output of the Pattern Counter 600 reads 1,0,0,1 and the chip selector lines TM37 or TL08 are activated by the Computer Control Unit 400 causing a "high" on line 49, the output of OR gate 47. The 1,0,0,1 output of the Pattern Counter indicates that ten patterns have been implemented. Similarly, the output of AND gate 53 will go "high" whenever the chip type selector line TM06 is "high" and the test generator is on its sixth pattern with a 1,0,1,0 output from the Pattern Counter 600.

Finally, the output of AND gate 55 will go "high" whenever the RAM test generator is on its 12th pattern, the last pattern for the 2M15 chip, with a 1,1,0,1 pattern on the output terminals of the Pattern Counter 600.

It should be noted that as described thus far, the very first bit of word 0 and the last bit of word "n" have not been exercised with a logical "1" and logical "0" respectively. It is therefore necessary to write and read a "1" in the first bit and to write and read on "0" in the last bit to complete the test. This is accomplished by the present tester through the use of the Invert Inputs line 94 and the Hold Pattern line 82. As soon as the Last Pattern line 59 goes "high", the Computer Control Unit 400 causes the Hold Pattern line 82 to go "low", thereby preventing the Pattern Counter 600 from being incremented. Then, when the Pattern Finished line 78 goes "high", the Computer Control Unit 400 brings the Invert Inputs line 94 "high" and continues to clock the RAM test generator. This tests the RAM with a complement of the last pattern. In this manner, every memory cell, including the first and the last, has had a "1" and a "0" written therein.

Figure 5:
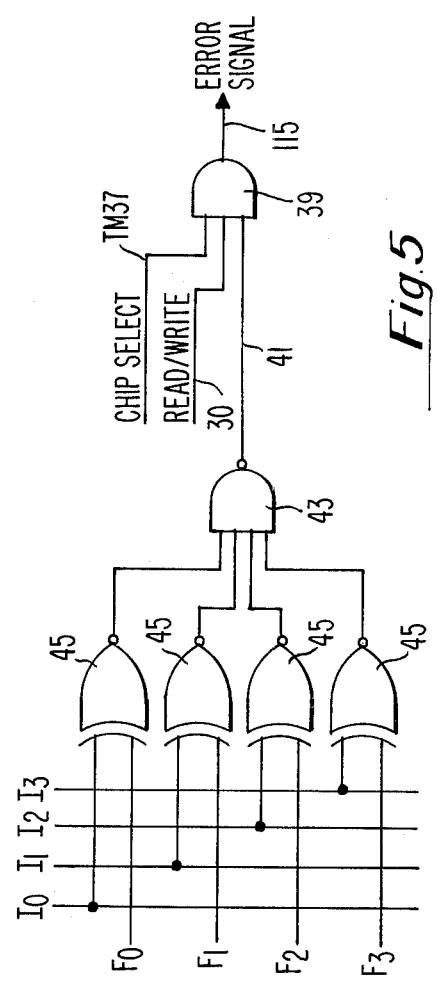
FIG. 5 is a representative logic circuit utilized to detect functional errors in a memory device under test.
Figure 3A:
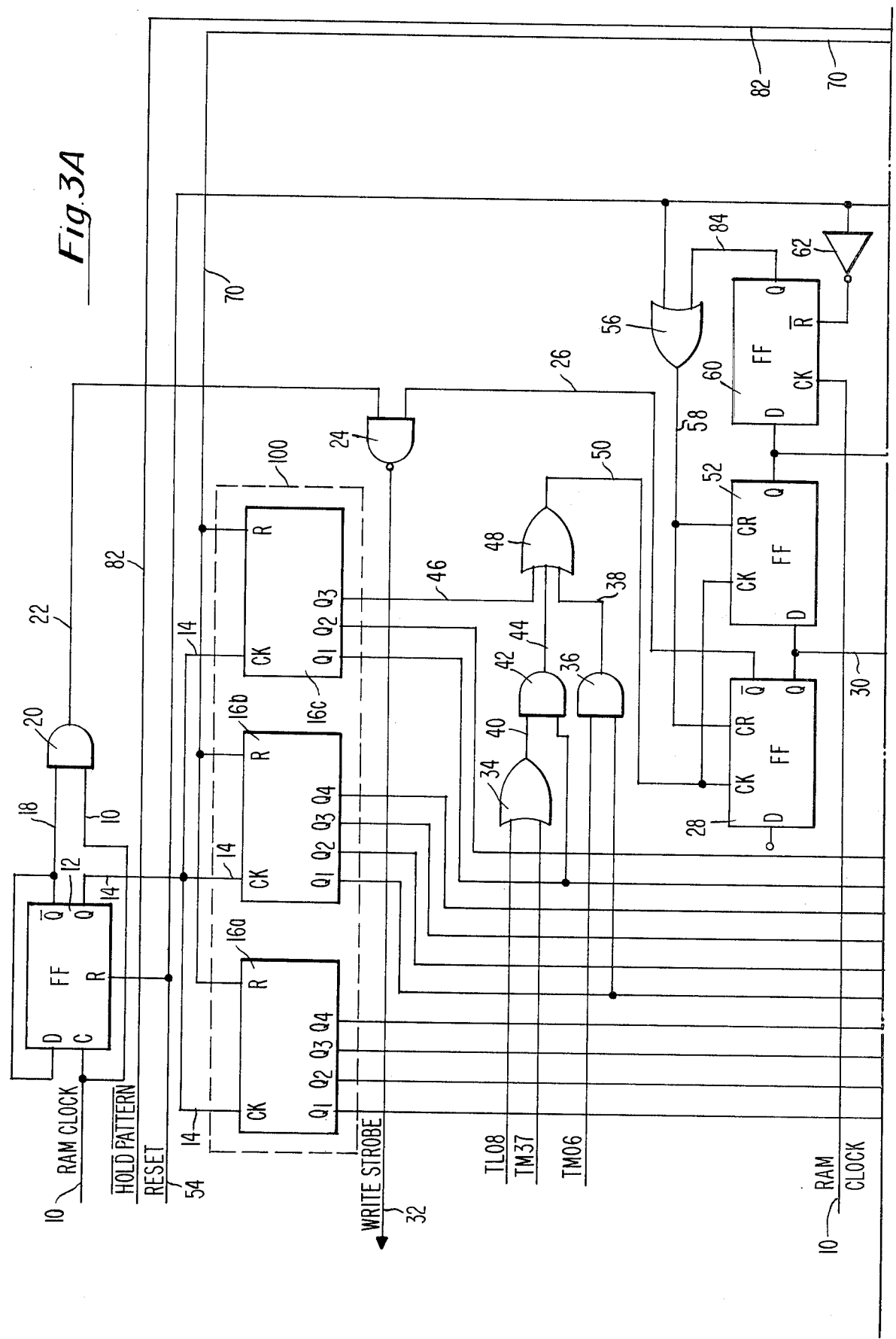
Figure 3B:
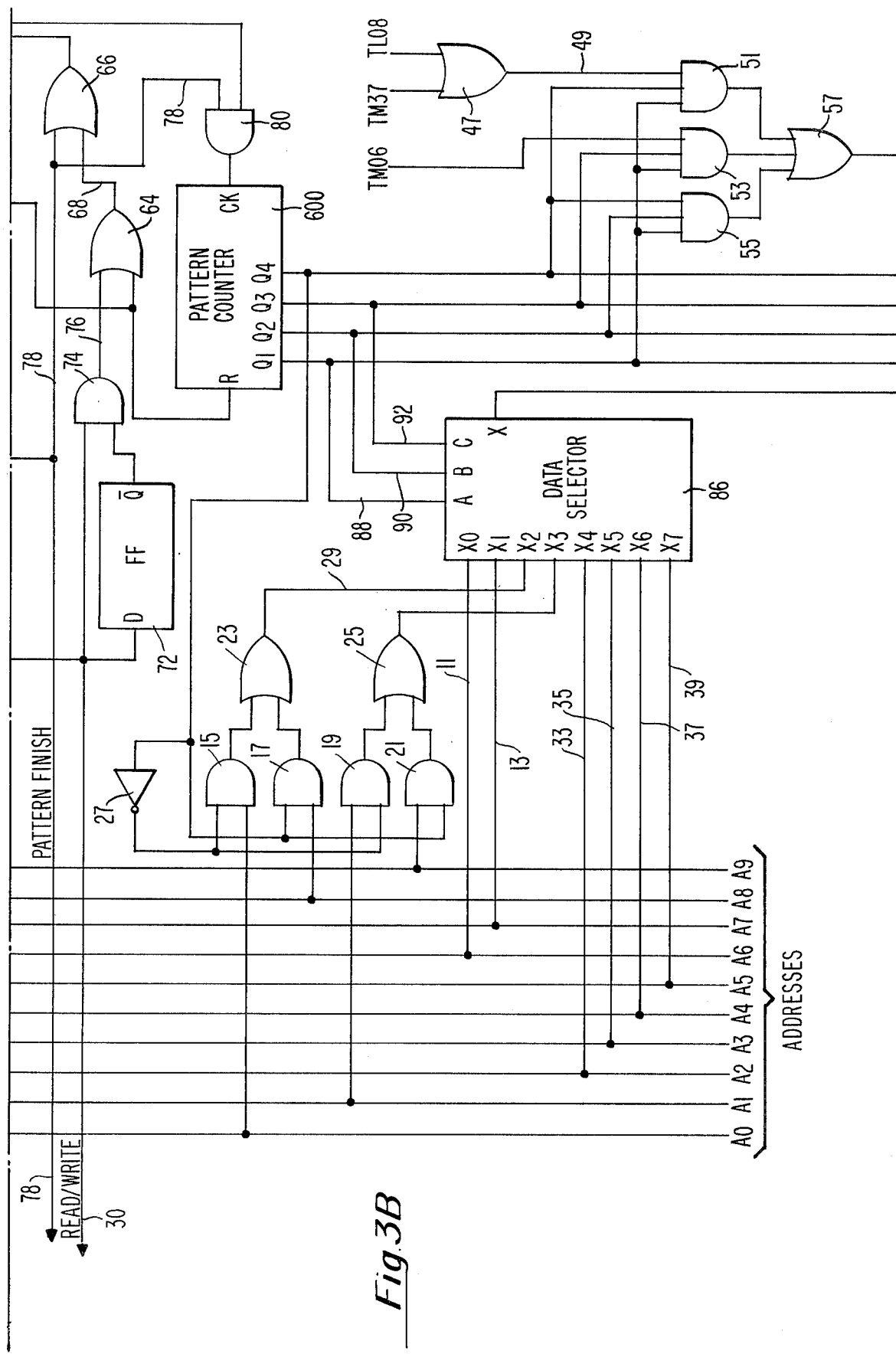

FIG. 5 is a diagram of the Error Detection Logic (shown as functional block 500 in FIG. 2), which for purposes of brevity has been made applicable solely to a representative RAM chip, such as the 2M37 chip described hereinbefore. It should be understood, however, that the following error detection techniques are applicable to all of the chip types mentioned herein, as well as to others not mentioned. Modifications of the Logic diagram of FIG. 5 to accommodate these other chips is well within the skill of the logic circuit designer.

With reference to FIG. 5, the outputs of the 2M37 chip appear respectively on lines $F_0$, $F_1$, $F_2$ and $F_3$ during the read portion of the test cycle. Concurrently, the inputs to the RAM from the test generator of the present invention appear on lines $I_0$, $I_1$, $I_2$ and $I_3$ respectively. Thus, the data on each pair of lines $F_0$, $I_0$; $F_1$, $I_1$; $F_2$, $I_2$ and $F_3$, $I_3$ are to be tested for equality. The respective pairs of lines appear as inputs respectively to Exclusive-NOR gates 45. The output of each Exclusive-NOR gate 45 will be "high" so long as both inputs thereto have the same logical value. The outputs of the Exclusive-NOR gates 45 are applied to a common NAND gate 43. The output of the last mentioned gate on line 41 will be "low" if each of the corresponding pairs of "F" and "I" lines have equal values indicating satisfactory RAM performance. A "high" level on line 41 is indicative of an error.

The output from NAND gate 43 on line 41 is applied to AND gate 39. The latter is enabled by a "high" on line 41 as well as "highs" on the Read/Write line 30 and the Chip Select line TM37. Concurrence of these "highs" produces an error signal on line 115 which is applied to Computer Control Unit 400 (FIG. 2) and utilized to provide a visual indication of their condition on a display panel. In an actual operative embodiment involving the testing of a number of RAM chips, the NAND gate outputs (corresponding to that on line 41) from each chip type may be applied as an input to AND gates corresponding respectively to the chip types desired to be tested. The other input to each of the last mentioned AND gates is provided by a corresponding Chip Select line. The outputs of all of the last mentioned AND gates are then applied to an OR gate. The output therefrom is indicative of a RAM error.

Figure 6:
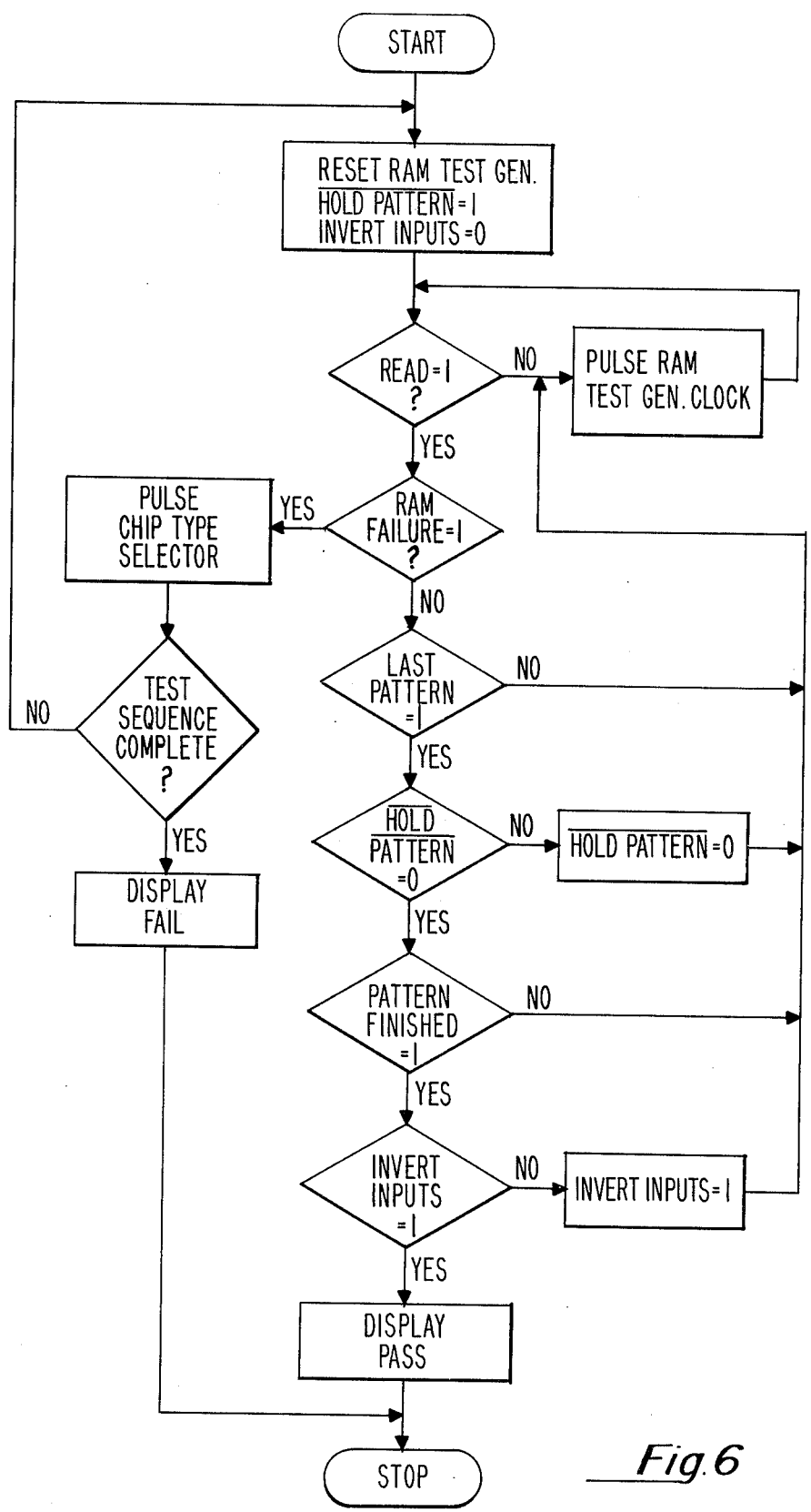
FIG. 6 is a flow diagram for the RAM testing procedure.

The RAM testing procedure as it applies specifically to the functions of the Computer Control Unit is defined by the flow-chart of FIG. 6.

Initiation of the test procedure by the operator results in the Computer Control Unit 200 (FIG. 2) pulsing the Reset line, 54 (FIG. 3) making the $\overline{\text{Hold Pattern}}$ line 82 "high", that is "1", and setting the Invert Inputs line 94 at "0".

If the Read/Write line 30 is "low", that is, not a "1", then the Computer Control Unit 200 supplies a pulse on Clock line 10 to the RAM test generator. As noted hereinbefore, the presence of a "low" or "0" level on the Read/Write line is indicative of the Write mode. Clock pulses on line 10 insure that a given pattern is written into all of the addresses for the selected RAM type. When this has been accomplished, the Read/Write line 10 will go "high", signalling the start of the Read cycle to determine whether or not the given pattern was in fact accurately stored at each address. The output signal line 115 (FIG. 5) of the Error Detection Logic 500 is monitored. The presence of a "1" on the last mentioned line is indicative of an error in the RAM. If in fact such an error is present, then "Ram Failure=1", and the "Chip Type Selector" is actuated. In practice the latter may be a counter, or the selection function whereby the "chip type" lines are actuated sequentially may be performed by the Computer Control Unit as indicated in the block diagram of FIG. 2. Since the RAM failure may have resulted from the actuation of a Chip Select line 108 not related to the particular chip under test, a failure may not be assumed until the Test Sequence for all of the possible chips for which the tester was designed, have been performed.

Assuming that the Test Sequence is not complete, the foregoing exercise of the RAM is commenced anew with the next succeeding Chip Select line actuated. However, the presence of an error from the Error Detection Logic 500 together with a signal from the "Chip Type Selector" indicating that all of the Chip Select lines 108 have been activated and that the Test Sequence is complete, results in the display of the RAM failure and the stopping of the test.

On the other hand, if no RAM failure is detected during the initial pattern exercise within the RAM, and the last pattern has not yet occurred, that is the Last Pattern line 59 remains "low", then the test generator continues to be clocked as the RAM is sequentially tested with a series of patterns. Ultimately it may be assumed for purpose of example that the last pattern of the series has been written into the memory. When the first address in the RAM containing the last pattern is read out to be checked for equality by the Error Detection Logic 500, the Last Pattern line 59 goes "high", and a "yes" output occurs from the Last Pattern block in the flow diagram. Inquiry is then made as to whether the $\overline{\text{Hold Pattern}}$ line is "0". Since it is not at this time, the $\overline{\text{Hold Pattern}}$ line is set to "0". The latter function disables the Pattern Counter 600 from incrementing in order that the last pattern may subsequently be run a second time with inverted data inputs to achieve complete testing, as described hereinbefore.

The setting of the $\overline{\text{Hold Pattern}}$ line to "0" pulses the RAM test generator clock and the second address is read and checked for equality. This action continues for all the remaining addresses as a result of the "no" responses to "Pattern Finished=1", which responses clock the test generator.

When the Pattern Finished line 78 goes "high" (after the last address has been read and checked for equality with the written pattern), inquiry is made as to whether the Invert Inputs line 94 is "high". Since it is not, the Invert Inputs line is set to a "1", and the RAM test generator clock is pulsed. This initiates a write cycle where the complement of the last pattern data is written into the respective RAM addresses, in the same manner as the preceding patterns. This is followed by a read and error checking cycle at each address as the RAM test generator is clocked by repeated "no" responses from the "Pattern Finished=1" block.

Assuming that no errors are detected, the read out of the data at the last address, causes the Pattern Finished line to become a "1". Since the Invert Inputs line was previously set to a "1", the "yes" output from the "Invert Inputs=1" block, provides a signal to a display indicating that the RAM has successfully passed the test. This indication is then utilized to stop the test.

In conclusion, the RAM test generator of the present invention provides a complete functional test of the static memory utilizing only a limited number of patterns of data input at considerable savings of test time. It should be understood that changes and modifications of the circuit organization presented herein may be needed to suit particular requirements. Such changes and modifications are well within the skill of the circuit designer, and insofar as they are not departures from the true scope and spirit of the invention, are intended to be covered by the following claims.

What is claimed is:

1. A test generator for detecting functional errors in a random access memory (RAM) which has a plurality of address lines and at least one data input line comprising:
   data selector means having a plurality of input terminals, a plurality of control terminals and an output terminal, said last mentioned input terminals being coupled to said address lines of said RAM,
   pattern counter means having an input terminal and a plurality of output terminals, means coupling respective ones of said last mentioned output terminals to the control terminals of said data selector means,
   said data selector means being responsive to the signal levels appearing on its respective control terminals as provided by said pattern counter means for coupling one of said address lines to its output terminal, and
   memory input means coupled to said output terminal of said data selector means and to the data input line of said RAM for providing on the latter, input data in the form of a bit pattern, the binary value of the bits in said pattern being a function of the signal levels appearing on the address line coupled to said data selector means output terminal.

2. A test generator as defined in claim 1 further including an address counter coupled to said address lines for sequentially addressing the RAM.

3. A test generator as defined in claim 2 further characterized in that said generator is initially in a write mode, write strobe means coupled to said RAM for writing a given pattern provided by said memory input means into each of the addresses provided by said address counter,
   last address detector circuit means coupled to said address counter for sensing the occurrence of the last address in said RAM into which said given pattern is written, and in response thereto, resetting said address counter and initiating a read mode in said test generator.

4. A test generator as defined in claim 3 further characterized in that said memory input means provides the same data input pattern to said RAM during the write and read mode portions of each test pattern cycle,
   said test generator further including error detection means coupled to said RAM and to said memory input means for comparing the bit pattern written into each RAM address with that read from the same address, said error detection means providing an output signal having a level indicative of the equality of the bit patterns.

5. A test generator as defined in claim 4 further characterized in that said last address detector circuit means is further adapted to sense the occurrence of the read out of the last RAM address in a test pattern cycle and in response thereto, resetting said address counter means and initiating the write mode for the succeeding cycle, said last mentioned circuit means being coupled to the input terminal of said pattern counter means and applying an incrementing signal thereto in response to the occurrence of said read out, of the last address, the incrementing of said pattern counter means altering the signal levels appearing in common on its output terminals and the control terminals of said data selector means, each such increment of the count in said pattern counter means resulting in a different address line being selected by said data selector means and a different bit pattern being provided to said RAM by said memory input means at the initiation of the write mode in each new test cycle.

6. A test generator as defined in claim 5 further characterized in that in response to successive incrementing of said pattern counter means, a sequence of data patterns is applied to the RAM by said memory input means to provide a complete test thereof, the number of patterns in said sequence required for completeness being a function of the bit organization of the RAM.

7. A test generator as defined in claim 6 further including circuit means coupled to said pattern counter means for detecting the occurrence of the last pattern in said sequence for a given RAM under test.

8. A test generator as defined in claim 7 wherein said memory input means comprises a logic unit having three AND gates and a NOR gate, each of said AND gates having a pair of inputs and an output, one of said inputs of each AND gate being connected in common to the output terminal of said data selector means, the other inputs of said AND gates being coupled respectively to the output terminals of said pattern counter means associated with the three more significant bits of the binary count of said pattern counter, said NOR gate having three inputs and an output, said AND gates having their outputs coupled respectively to said NOR gate inputs, the signal level appearing on the gate output of said NOR gate being the output of said logic unit and being the complement of the signal on the output terminal of said data selector means,
   four Exclusive-OR gates each having an output terminal providing an input to each RAM data input line, each of said Exclusive-OR gates having a pair of inputs, one of said inputs of each of the last mentioned gates being coupled in common to a source selectively providing one of a pair of signal levels, the other input of one of said Exclusive-OR gates being coupled to the output of said logic unit,
   three additional AND gates each having a pair of inputs and an output, one of said inputs of each of said additional AND gates being coupled in common to the output of said logic unit, first and second OR gates each having a pair of inputs and an output, a third OR gate having three inputs and an output, the respective outputs of said first, second and third OR gates being coupled to the other inputs of said additional AND gates, the respective outputs of said additional AND gates being applied to the other inputs of the three remaining Exclusive-OR gates,
   the three inputs of said third OR gate being coupled to said output terminals of said pattern counter means associated with said three more significant bits of the binary count of said pattern counter, one of said pair of inputs of said first OR gate being coupled directly to the output terminal of said pattern counter means associated with the least significant bit of the binary count of said pattern counter, logical inverter means coupling one of said pair of inputs of said second OR gate to said last mentioned output terminal of said pattern counter means, the output of said third OR gate being applied in common to the other inputs of said first and second OR gates.

9. A test generator as defined in claim 8 further characterized in that the word accessed at each memory address of said RAM is comprised of four bits, said memory input means providing first, second, third and fourth data inputs on the respective data input lines of said RAM.

10. A test generator as defined in claim 9 further characterized in that said sequence of input data patterns includes a first series of patterns provided whenever the signal level of at least one of the output terminals of said pattern counter means associated with the three more significant bits of the binary count of said pattern counter is "high", the levels of said first, second, third and fourth data inputs being alike and being the complement of the signal level appearing on the output terminal of said data selector means.

11. A test generator as defined in claim 10 further characterized in that said sequence of data patterns includes a second series of two patterns provided whenever the signal levels of the three more significant bits of the binary count of said pattern counter are all "low" and the least significant bit is respectively "low" and "high", the first and third data inputs being "high" and the second and fourth data inputs being "low" whenever said least significant bit of the pattern counter is "low", and the first and second data inputs being "high" and the third and fourth data inputs being "low" when said least significant bit is "high".

* * * * *

UNITED STATES PATENT AND TRADEMARK OFFICE
CERTIFICATE OF CORRECTION

PATENT NO. : 4,195,770
DATED : April 1, 1980
INVENTOR(S) : Michael K. Benton; Suresh H. Sangani It is certified that error appears in the above-identified patent and that said Letters Patent are hereby corrected as shown below:

Column 3, line 12 - change "divided" to --derived--.

Column 7, line 18 - change "$\overline{Q}$" to --Q--.

Column 7, line 19 - change "Q" to --$\overline{Q}$--.

Signed and Sealed this

Twenty-fourth Day of June 1980

[SEAL]

Attest:

SIDNEY A. DIAMOND

Attesting Officer

Commissioner of Patents and Trademarks